United States Patent [19]

Sportelli

[11] Patent Number: 4,495,517

[45] Date of Patent: Jan. 22, 1985

[54] PRINTING SCREEN AND METHOD OF MAKING SAME

[76] Inventor: Frank A. Sportelli, 7 Redwood Court, Glen Cove, N.Y. 11542

[21] Appl. No.: 289,602

[22] Filed: Aug. 3, 1981

Related U.S. Application Data

[62] Division of Ser. No. 090,763, Nov. 2, 1979, Pat. No. 4,283,471.

[51] Int. Cl.³ ............................................... H04N 1/46
[52] U.S. Cl. ...................................... 358/75; 350/316; 350/322; 353/84
[58] Field of Search ................. 358/75, 298; 350/316, 350/322; 353/84

[56] References Cited

U.S. PATENT DOCUMENTS 4,084,183  4/1978  Keller et al. ........................... 358/75
4,342,046  7/1982  Kamata ................................. 358/75

*Primary Examiner*—Richard Murray
*Attorney, Agent, or Firm*—Neil F. Markva

[57] ABSTRACT

A printing plate is made in accordance with a particular method and is used in a printing process wherein it is effective to produce a substantially continuous tone printing effect. A negative screen having an overall pattern defined by rows of closely spaced substantially square-shaped areas is exposed a plurality of times on an image carrier. An image screen pattern is developed on the image carrier wherein each of the plurality of exposures of the overall pattern on the negative screen is effected at a different angle with respect to each other. A unique printing screen pattern is obtained which is then used for printing a reproduced image.

3 Claims, 5 Drawing Figures

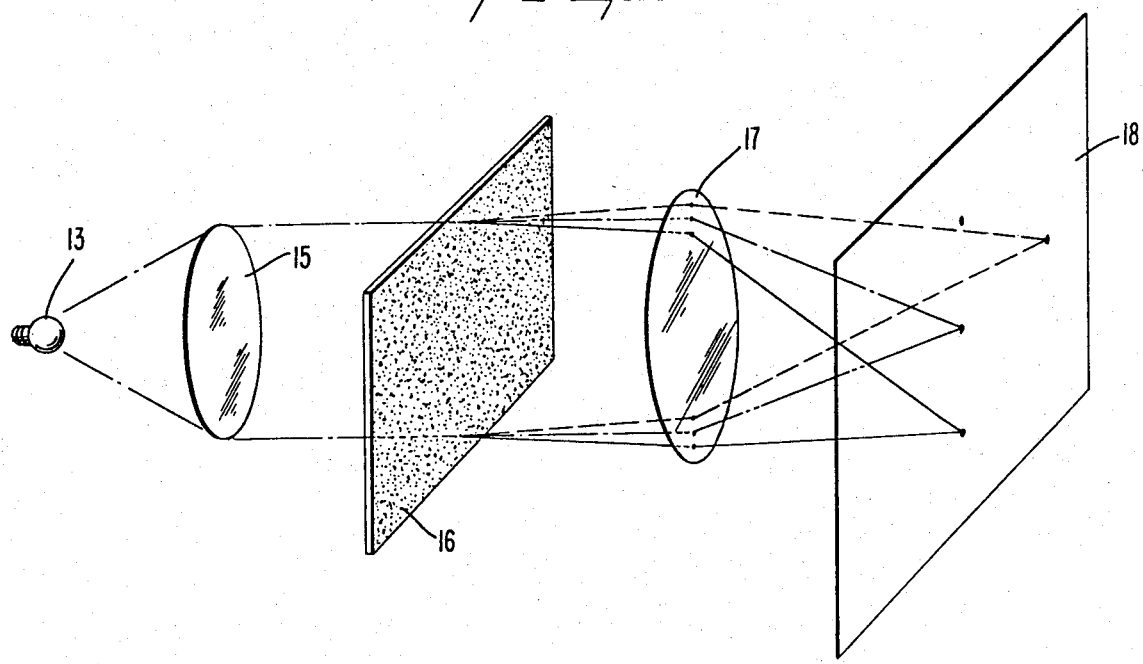
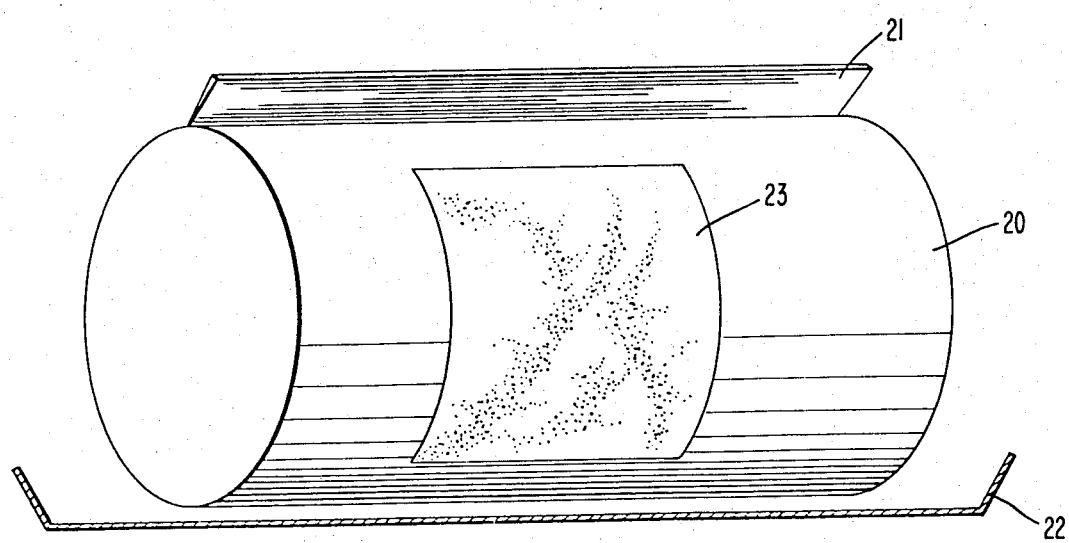

PRINTING SCREEN AND METHOD OF MAKING SAME

This is a division of application Ser. No. 090,763 filed Nov. 2, 1979, now U.S. Pat. No. 4,283,471, 08/11/81.

FIELD OF INVENTION

This invention relates to photoprinting image elements such as printing plates and a method of producing same for use in printing processes. More particularly, the invention relates to color reproduction printing such as gravure or intaglio printing involving the use of a novel screen pattern on a printing plate or light transmitting element.

BACKGROUND OF THE INVENTION

It is known to etch the printing surface of each printing plate used in color reproduction printing to provide circular or rectilinear patterns composed of a various number of wells or cells per square inch. The wells may all have the same surface area with varying depths to control the tonal shading or coloration. Alternatively, the depth of the wells may remain constant and the surface of the wells be varied to achieve the same differences in shading or tone and color reproduction. This style of printing is conventional and disclosed in U.S. Pat. No. 923,799.

This gravure type printing conventionally has well depths which vary from 35 microns for solid colors to 2 microns for the light color tones or tints. In some cases, greater depths are required. Wear along the printing surface rapidly changes the volume in the extremely shallow wells, thereby causing well known disadvantages. As known, each of the wells is separated by a bridge defined by a solid printing surface section. At the areas of contact between the paper and the bridge surface, there is no ink transfer. The small size of the individual wells, the bridge surfaces, the wear of the printing plate, and the inability of capillary action to adequately remove all of the ink from the well during the printing process wherein ink is transmitted from the well to the paper, each contributes to a discontinuous and irregular printing result.

Conventionally, a color image is reproduced by superpositioning imprints from a plurality of screen pattern, color separation plates. The multi-color photo engraving practice is often impaired by objectionable interference or moire patterns. These appear as objectionable grid patterns having a distinct geometric design. Furthermore, if the printed or reproduced image is magnified, a reproduction of the pattern of the printing screen is seen to exist. One prior art attempt to obviate this problem involves the use of a plurality of photoengravers' screens being rotated through different angles relative to a horizontal base line for several exposures onto the color separation plates used in the multi-color photoengraving printing process. That is, the separate screens are disposed, one on top of the other, and rotated to different angles with respect to a horizontal base line for the several exposures so that the lines of the screen patterns fall at different angles with respect to the base line. Each plate, or screen, used is for a different color. This prior art procedure is fairly common. However, the presence of a screen pattern in the reproduced image is still present.

The prior art associated with this particular field is exemplified by the U.S. Pat. Nos. 521,659, 1,872,943, 2,206,054, 2,360,587, 2,757,087, 2,768,577, 2,798,428, 3,288,059 and 3,450,044. All of these patentees describe printing procedures which are related to the production of printing screens and the use of same during the printing of a reproduced image. While these set forth conventional multi-screening procedures to reproduce both black and white and color reproductions, none of these prior art procedures has resulted in the production of a substantially continuous tone printing effect wherein the printed or reproduced image includes no trace of a screen or grid pattern particularly under magnified conditions.

The U.S. Pat. Nos. 2,200,285, 2,621,245 and 3,663,221 each relates to the use of separate gratings to transmit separate colors to an image screen. However, none address the specific problem solved with the instant invention.

SUMMARY OF THE INVENTION

The primary object of this invention is to produce a light transmitting plate having a predetermined design of indicia thereon wherein said plate may be used during the printing of reproduced images.

Another object of the invention is to provide a photoprinting image element and a method of making same for the purpose of producing a screened relief pattern on a printing plate.

A further feature of the invention is to provide a printing screen pattern used in a printing process for producing a substantially continuous tone printing effect.

A still further object of the invention is to provide a method for producing an image screen pattern on an image carrier such as a photographic film, an engraved printing plate and the like.

The printing screen of this invention, referred to as the ILLETROPS screen, has a unique predetermined design composed of a pattern of polygonal dots, circles, arcs and regular shapes. The method of the invention comprises exposing a negative screen having a plurality of parallel, equidistant lines located thereon onto a photographic film in a plurality of separate exposures. The negative screen is disposed at a predetermined angle in each of the separate exposures. Each said predetermined angle is at a different angle with respect to each other. The exposed photographic film is then developed to produce a photoprinting image element having a screen pattern which may then be used to form a printing plate useful in conventional printing processes.

More specifically, the negative screen has an overall pattern comprising rows of closely spaced substantially square-shaped areas. The negative screen is a gravure negative screen and is first placed at a 105° angle and exposed onto a photographic graphic arts film. The fine line negative gravure screen is then placed at the 75° angle disposition and exposed onto the same film. Finally, a third exposure is made onto the film with the negative gravure screen placed at the 45° angle disposition. The disposition of any grating at a particular angle is known in the printing industry. The developed film exposed according to the invention produces a product referred to as the ILLETROPS screen which is usable in the gravure process. The ILLETROPS screen has a very fine texture with properties which render it adaptable to gravure etching and press running. Such a screen of this invention has a firm foundation for corrections such as burnishing and chrome plating to increase press run life.

The ILLETROPS screen may be used for photoengraving and offset systems in addition to the gravure printing process. It has been found that even with low quality newspaper stock that reproduced images formed through printing with the ILLETROPS screen is substantially invisible on the reproduced image and thus creates a continuous tone printing effect. The results achieved on printing increase markedly with the better quality of paper stock used during the printing procedures.

BRIEF DESCRIPTION OF DRAWINGS

Other objects of this invention will appear in the following description and appended claims, reference being made to the accompanying drawings forming a part of the specification wherein like reference characters designate corresponding parts in the several views.

FIG. 4 is a schematic diagram showing the projection of light through a light transmitting element made in accordance with this invention; and FIG. 5 is a perspective view partly in section showing a cylindrical printing plate bearing the image design made in accordance with the process of this invention to provide a multi-color reproduction.

DETAILED DESCRIPTION

Figure 1:
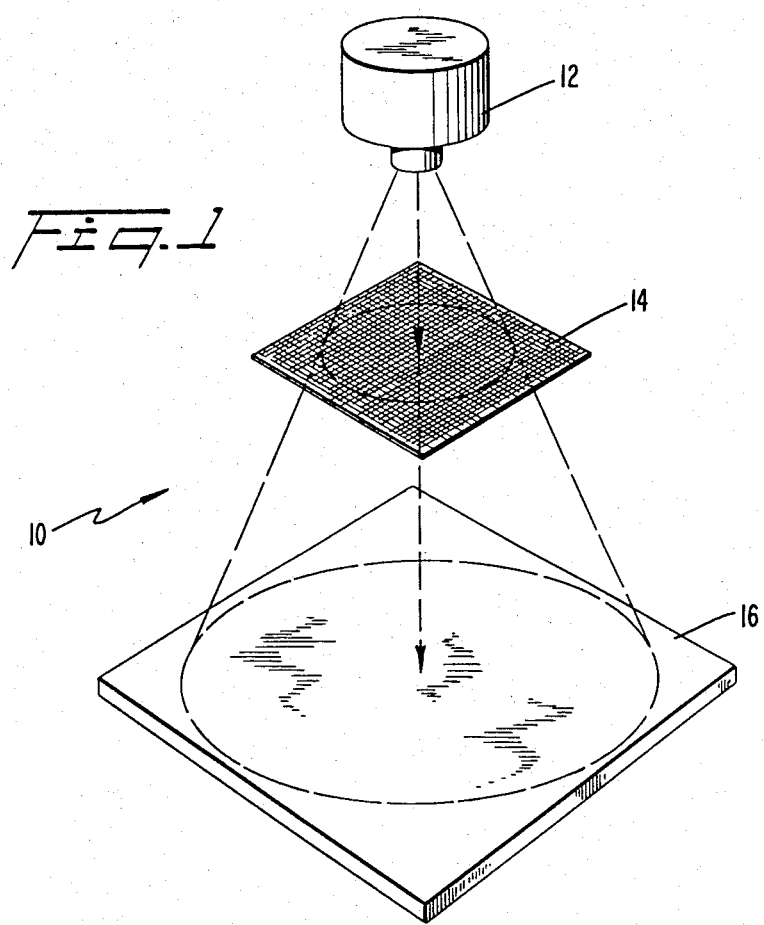
FIG. 1 is a perspective view of an assembly used to effect the process of the present invention.
Figure 2:
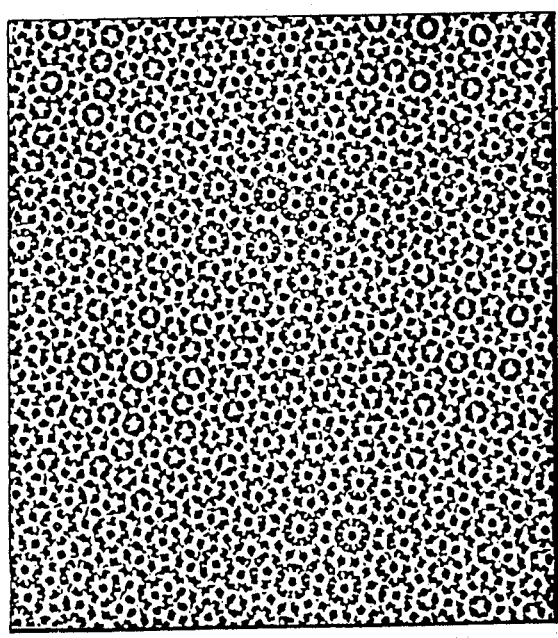
FIG. 2 is a plan view showing the design of the light transmitting plate having an image developed according to the invention.
Figure 3:
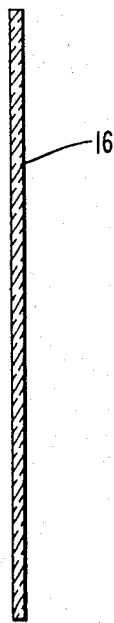
FIG. 3 is an elevational view of the screen of FIG. 2.

A conventional assembly for producing a photoprinting image element is shown in FIG. 1. A film emulsion carrier 16 is positioned to receive an image as a result of the light projector 12. A gravure negative screen 14 is disposed between the projector 12 and the emulsion carrier 16 which may be a film emulsion such as DuPont C.O.S. 4 or Eastman Ortho Type 3. The light source used in this embodiment is designated TAP 3 at 2400 Kelvin.

The photographic film emulsion 16 receives 3 separate exposures. The gravure negative screen 14 may have from about 200 to 300 lines per inch forming its grid pattern of squares. In this particular embodiment, the gravure screen 14 has 300 rulings or lines per inch. The first exposure onto the photographic film 16 is made with the screen 14 disposed on the 105° angle. A second exposure is then made on the 75° angle and the third exposure is made on a 45° angle. As stated above, the disposition of any gravure screen grating at a particular angle is known in the printing industry. Each of the series of exposures is made with the gravure screen 14 being disposed at angles that are 30° with respect to each other. In this particular embodiment, each exposure is about 7 seconds from the light source projector 12.

The photographic film 16 is then developed in a normal line developer which may be DuPont Crovalith processor. The developing time is about one minute.

The developed photographic film 16 shows a novel design which is then usable as a photoprinting image element having a regular screen pattern as shown. The precise disposition of the gravure screen 14 will render a screen pattern having no imperfections or moire effect. The exposed photographic film 16 with the pattern may be used in combination with a projected image as shown in FIG. 4 to obtain an image having no moire effect on the image seen on the screen. A light source 13 illuminates the image used in combination with the ILLETROPS screen 16 through the lens system 15. Images focused by the lens system 17 onto the image plane or projecting screen 18 are seen without any moire effects or patterns.

The multi-color image which is producible through the use of the ILLETROPS screen of this invention is achieved through the use of a series of printing plates 20 wherein each color being printed is used with a different plate. Each of the cylindrical printing plates 20 includes a source of ink in the shallow pan 22. Each plate 20 rotates with its outer surface moving into the ink carrying pan 22 and filling the various wells 23 formed in a pattern like that produced on the photographic film 16. The doctor blade 21 wipes any excess ink off the printing surface formed by the wells 23. The same pattern found on the photographic film 16 exists on each of the cylinders 20 used to print the various colors if there is a multi-color system. Obviously, if it is black and white printing, only one cylinder is necessary.

While the printing screen has been shown and described in detail, it is obvious that this invention is not to be considered as being limited to the exact form disclosed, and that changes in detail and construction may be made therein within the scope of the invention, without departing from the spirit thereof.

I claim:

1. In a television transmission process, the method comprising:
    (a) providing a light transmitting element made in accordance with the process of (i) providing a negative screen having an overall pattern defined by rows of closely spaced substantially square-shaped areas, (ii) providing an image carrier effective to receive three separate exposures of said overall pattern at the same location on the negative screen, and (iii) developing an image screen pattern on said image carrier wherein each of said plurality of expsoures of said overall pattern is effected at a different angle with respect to each other, and then
    (b) using said light transmitting element for transmitting a reproduced image.

2. A light transmitting plate having a predetermined design of indicia thereon, said plate comprising:
    (a) an indicia bearing side,
    (b) said indicia being disposed on said indicia bearing side and being composed of photographically opaque material,
    (c) said predetermined design including a pattern of polygonal dots, circles, arcs and regular shapes.

3. A light transmitting plate as defined in claim 2 wherein:
    said predetermined design includes a developed multi-exposed photographic film emulsion defining said pattern.

* * * * *